United States Patent
Abassi et al.

(10) Patent No.: US 6,646,512 B2
(45) Date of Patent: Nov. 11, 2003

(54) SELF-BIAS AND DIFFERENTIAL STRUCTURE BASED PLL WITH FAST LOCKUP CIRCUIT AND CURRENT RANGE CALIBRATION FOR PROCESS VARIATION

(75) Inventors: Saeed Abassi, Wynnewood, PA (US); Martin E. Perrigo, Newtown, PA (US); Carol Price, Jamison, PA (US)

(73) Assignee: ATI International, SRL, Barbados (KN)

( * ) Notice: Subject to any disclaimer, the term of this patent is extended or adjusted under 35 U.S.C. 154(b) by 0 days.

(21) Appl. No.: 09/730,954

(22) Filed: Dec. 6, 2000

(65) Prior Publication Data

US 2002/0067214 A1 Jun. 6, 2002

(51) Int. Cl.[7] .............................................. H03L 7/085
(52) U.S. Cl. ........................... 331/17; 331/1 A; 331/25; 331/185; 331/DIG. 2; 331/57
(58) Field of Search ............................. 331/17, 16, 25, 331/1 A, 185, 57, DIG. 2; 327/156, 159

(56) References Cited

U.S. PATENT DOCUMENTS 5,939,949 A  *  8/1999  Olgaard et al. ............... 331/17

6,285,725 B1  *  9/2001  Sung et al. ................ 331/17 X

OTHER PUBLICATIONS

Johns et al., "Analog Integrated Circuit Design", 1997, Canada, Chapter 16, pp. 675–679.
Maneatis, John G., "Low–Jitter Process–Independent DLL and PLL Based on Self–Biased Techniques", IEEE Journal of Solid State Circuits, vol. 31, No. 11, pp. 1723–1732, Nov. 1996.
Baker et al., "CMOS Circuit Design, Layout, and Simulation", 1998, Chapter 19, pp. 417–423.

* cited by examiner

*Primary Examiner*—Arnold Kinkead
(74) *Attorney, Agent, or Firm*—Volpe and Koenig, P.C.

(57) ABSTRACT

A phase locked loop (PLL) circuit adjusts a voltage controlled differential oscillator to generate an output frequency signal, which is a selected multiple of an input reference signal. The PLL circuit includes an oscillator control circuit for increasing and decreasing the PLL output frequency signal, a frequency detector for detecting a phase shift between the reference signal and the PLL output signal and produces an error signal, and a fast lock circuit for detecting when the output frequency signal passes the selected multiple of the reference signal. This circuit design provides improved jitter performance, tolerates process variation, and extends the PLL operating frequency range.

9 Claims, 4 Drawing Sheets

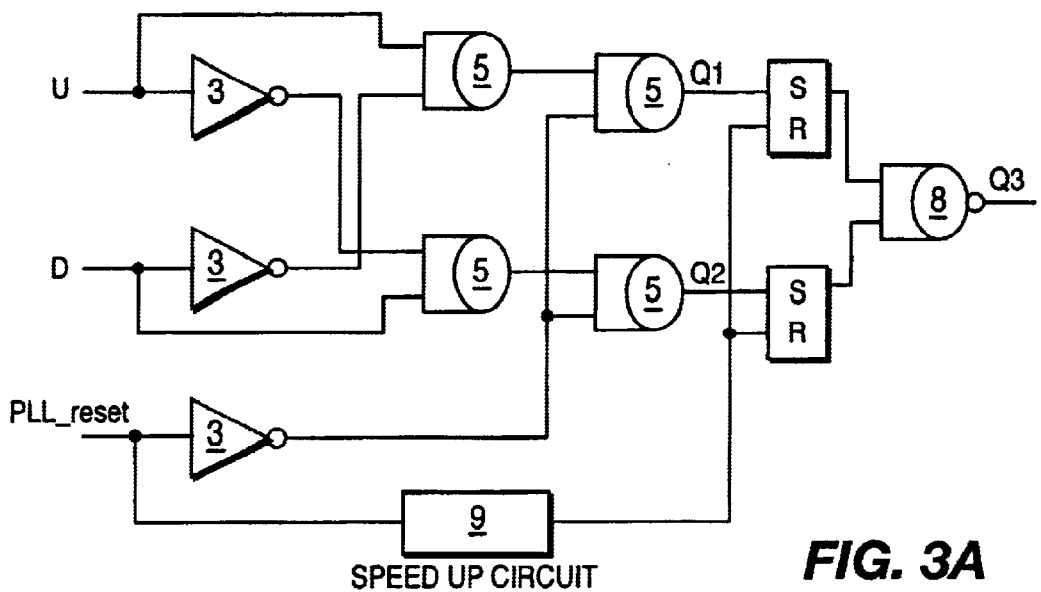
FIG. 3A
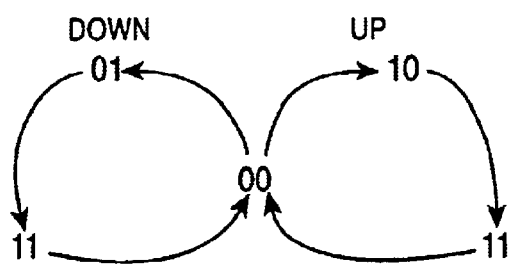
FIG. 3B
| UP | DOWN | Q1 | Q2 | Q3 |
|---|---|---|---|---|
| 0 | 0 | 0 | 0 | 1 |
| 0 | 1 | 0 | 1 | 1 |
| 1 | 1 | 0 | 1 | 1 |
| 0 | 0 | 0 | 1 | 1 |
| 0 | 1 | 0 | 1 | 1 |
| 1 | 1 | 0 | 1 | 1 |
| - | - | - | - | 1 |
| 0 | 0 | 0 | 1 | 1 |
| 1 | 0 | 1 | 1 | 0 |
| 1 | 1 | 1 | 1 | 0 |
| 1 | 1 | 1 | 1 | 0 |
| - | - | - | - | 0 |
| 0 | 0 | 1 | 1 | 0 |
| 0 | 1 | 1 | 1 | 0 |
| 1 | 1 | 1 | 1 | 0 |
| - | - | - | - | 0 |
| 0 | 0 | 1 | 1 | 0 |
| 1 | 0 | 1 | 1 | 0 |
| 1 | 1 | 1 | 1 | 0 |
| - | - | - | - | 0 |
FIG. 3C

SELF-BIAS AND DIFFERENTIAL STRUCTURE BASED PLL WITH FAST LOCKUP CIRCUIT AND CURRENT RANGE CALIBRATION FOR PROCESS VARIATION

BACKGROUND

The present invention relates generally to phase locked loop (PLL) circuits. More particularly, this invention relates to a PLL circuit which is based on a voltage controlled differential oscillator and an advanced common biasing technique, which tolerates process variations and calibrates current ranges for operational request frequency that provides frequency stability with temperature change without the use of a bandgap reference bias circuit.

Phase-locked loops are often used in the I/O interfaces of digital integrated circuits in order to hide clock distribution delays and to improve overall system timing. The maintenance of the timing throughout a circuit is important. Timing becomes particularly critical for applications requiring high-speed processing of information, such as with video processors.

The timing throughout a circuit deviates from the system clock when noise is introduced by various system components and as a result of capacitive effects due to system interconnections. In recent years, the demand has risen for devices capable of high-speed processing. As a result, the demand for PLL circuits that quickly compensate for electronic noise and capacitive delays has also risen. The problem is that the amount of phase shift produced as a result of the supply, substrate noise and capacitor load is directly related to how quickly the PLL can correct the output frequency.

One type of design used by those skilled in the art to eliminate the noise present in the circuit at the required speed is a self-bias signal technique. Referring to FIG. 1, this prior art PLL circuit is a self-biasing configuration which is composed of a phase comparator, charge pump, loop filter, bias generator and a voltage-controlled oscillator (VCO). This PLL circuit also uses an additional charge pump current to the bias generator $V_{bp}$ output. For a typical PLL, the charge pump current and the loop filter resistance are constant. These conditions give rise to a constant damping factor and a constant loop bandwidth. A constant loop bandwidth can constrain the achievement of a wide operating frequency range and low input tracking jitter. If the frequency is disturbed, the phase error that results from each cycle of the disturbance will accumulate for many cycles until the loop can compensate for the frequency error. The error will be accumulated for a number of cycles, which is proportional to the operating frequency divided by the loop bandwidth. Thus the loop bandwidth would have to be positioned as close as possible to the reference frequency bandwidth to minimize the total phase error. The result is that the frequency bandwidth must be conservatively set for stability at the lowest operating frequency with worst case process variations, rather than set for optimized jitter performance. The self-biased PLL also exhibits much faster locking times only when locking from similar or higher operating frequencies. If, however, the self-biased PLL is started at a very low operating frequency, it will exhibit very slow locking times.

Accordingly, there is a need for a PLL circuit which provides a fast lock-up, improved jitter performance, tolerates process variations, and extends the PLL operating frequency range.

SUMMARY

The present invention is a phase locked loop (PLL) which is based on a common bias technique, comprising a voltage controlled differential oscillator, fast lock-up circuit, self-calibration current range setting circuit and a high-speed phase frequency detector. This design provides improved speed in locking to the frequency of an incoming signal, extends the PLL operating frequency range, improves PLL jitter performance, and provides greater immunity to environmental noise, which results in improved power supply rejection ratio (PSRR).

BRIEF DESCRIPTION OF THE DRAWINGS

FIG. 3A is a logic gate diagram of the speed-up circuit in accordance with the preferred embodiment of the present invention;

FIG. 3B is a state diagram of the speed-up circuit inputs in accordance with the preferred embodiment of the present invention;

FIG. 3C is a logic table for the speed-up circuit in accordance with the preferred embodiment of the present invention;

DESCRIPTION OF THE PREFERRED EMBODIMENTS

Figure 1:
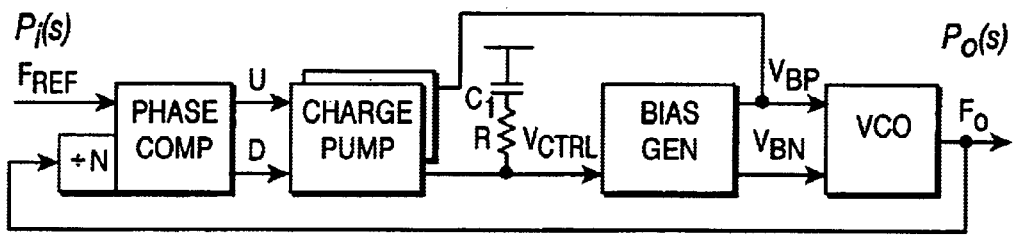
FIG. 1 is a typical PLL block diagram.

The first embodiment of the present invention will be described with reference to the drawing figures wherein like numerals represent like elements throughout.

Figure 2:
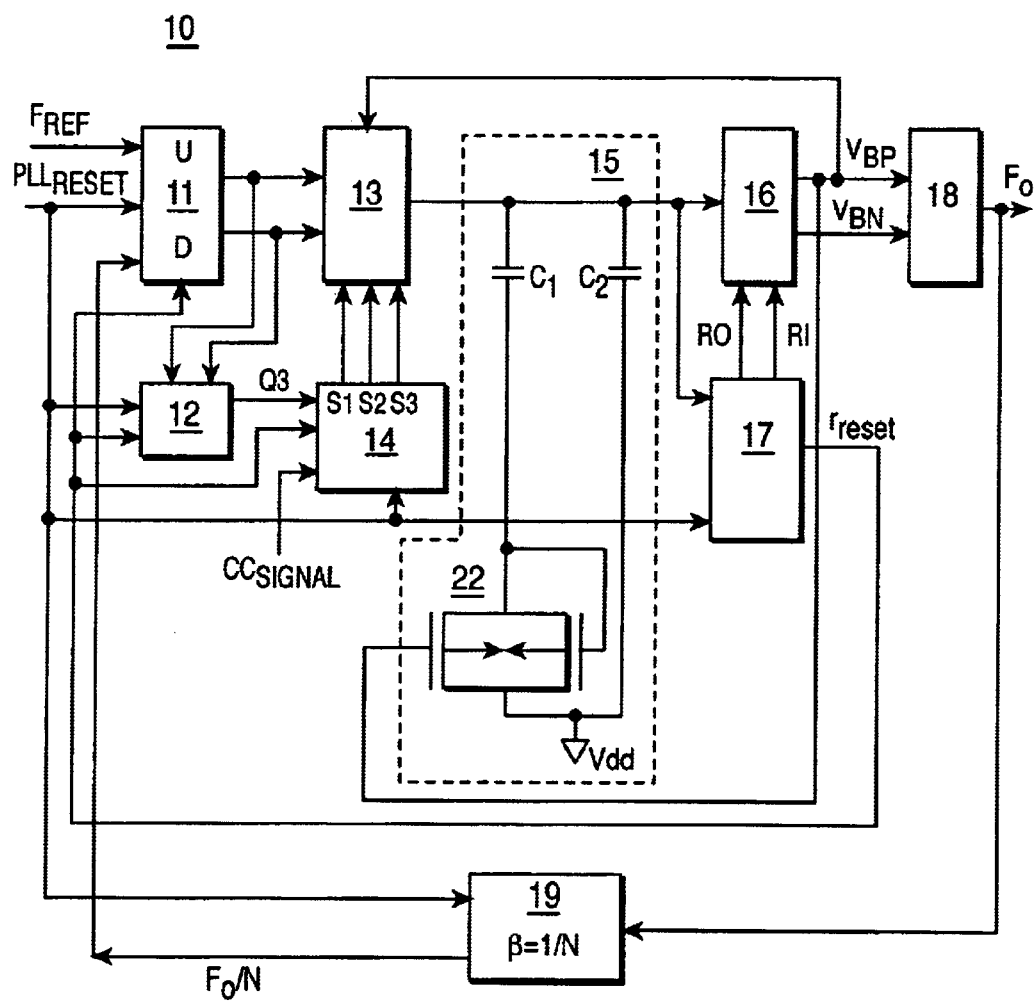
FIG. 2 is a block diagram of the circuit in accordance with the preferred embodiment of the present invention.

Referring to FIG. 2, a PLL circuit 10 made in accordance with the present invention is shown. The PLL circuit 10 includes a phase frequency detector (PFD) 11, a speed-up circuit 12, a charge pump 13, a charge pump control circuit 14, a loop filter 15, a bias generator 16, a current range control circuit 17, a voltage-controlled oscillator (VCO) 18, and a frequency divider 19. The PLL circuit 10 receives a reference frequency $F_{ref}$ from an outside source. Along with the reference frequency $F_{ref}$, the phase frequency detector (PFD) 11 receives a reset signal $PLL_{reset}$ and the divided PLL 10 output frequency signal $F_O/N$. Coupled to the phase frequency detector 11 are the speed-up circuit 12 and the charge pump 13. As those skilled in the art should know, the PFD 11 determines the phase and frequency difference between the reference frequency $F_{ref}$ and the divided PLL 10 output signal $F_O/N$. If the PFD 11 detects a difference between the two input signals $F_{ref}$, $F_O/N$, the phase error signals U, D are sent to the speed-up circuit 12 and the charge pump 13. The duration of the output signals U, D pulse widths depend on the amount of phase and frequency error that is detected by the PFD 11.

The speed-up circuit 12, shown in FIG. 3A, is controlled by the phase error signals U, D output from the PFD 11.

Coupled to the PFD 11 and the charge pump control switch 14, the speed-up circuit 12 receives the phase error signals U, D and a reset signal $PLL_{reset}$. The purpose of the speed-up circuit 12 is to monitor the crossing of the PLL 10 output frequency $F_O/N$ and the reference frequency $F_{ref}$, as will be disclosed hereinafter. The speed-up circuit 12 comprises a plurality of invertors 3, a plurality of AND gates 5, two S–R flip flops 7, a NAND gate 8, and a delay stage 9. Initially, when the PLL circuit 10 receives a reset signal $PLL_{reset}$, the speed-up circuit 12 signals the charge pump control switch 14 to adjust the charge pump 13 current to the maximum. When the speed-up circuit 12 detects the crossing of the two frequencies $F_O$, $F_{ref}$, the speed-up circuit 12 signals the charge pump control switch 14 to reduce the charge pump 13 current. The output of the speed-up circuit 12, as the PLL circuit 10 attempts to match the output frequency $F_O/N$ with the reference frequency $F_{ref}$, is illustrated in the state diagram of FIG. 3B and the logic table of FIG. 3C.

Referring to FIGS. 3B and 3C, when the speed-up circuit 12 receives the reset signal $PLL_{reset}$ and the reset PFD 11 outputs U, D, the speed-up circuit 12 signals the charge pump 13 to output its maximum current, thus discharging the loop filter capacitor C1 to 0V. This triggers the VCO 18 to output its maximum frequency $F_O$. The PLL 10 output frequency $F_O/N$ will decrease as the capacitor C1 charges and will eventually be equal to the reference frequency $F_{ref}$. This condition is identified by U, D changing from 00,01,11 to 00,10,11. As the PLL 10 comes out of reset, the signals U, D are in the state 0,0. Since the PLL 10 output frequency $F_O/N$ is faster than the reference frequency $F_{ref}$, the next state of U, D is 0, 1. This indicates to the charge pump 13 to charge the capacitor C1, reducing the PLL 10 output frequency $F_O/N$. On the next rising edge of the reference frequency $F_{ref}$, the signals U, D go to 1, 1. This state causes the PFD 11 to reset and return U, D to its neutral state 0, 0. This process continues until the PLL 10 output frequency $F_O/N$ is slower than the reference frequency $F_{ref}$. This condition is indicated by the U, D signals going to a state 1, 0. This condition signals the speed-up circuit 12 to output a logical zero (0) $Q_3$ to the charge pump control circuit 14, indicating that the charge pump 13 should reduce its current to the level prescribed by the charge control signal $CC_{signal}$ to be disclosed hereinafter.

The speed-up circuit 12 operates to quickly detect the matching of the reference and output frequencies $F_{ref}$, $F_O/N$, and then output a control signal $Q_3$ to the charge pump control circuit 14 to reduce the current of the charge pump 13 in order to find the optimal bias current range $I_{bias}$, as will be disclosed hereinafter, to be output to the VCO 18. This speed-up circuit 12 provides a fast frequency lock by signaling the initialization of the charge pump 13 current output to its maximum and signaling for the reduction of this current when the frequencies $F_{ref}$ and $F_O/N$ are equal.

Referring back to FIG. 2, the control signal $Q_3$ output from the speed-up circuit 12 is a logical one or a logical zero and is received by the charge pump control circuit 14, which is coupled to the speed-up circuit 12 and the charge pump 13. The charge pump control circuit 14, using a variation of switches, converts the signal from the speed-up circuit 12 and the charge control signal $CC_{signal}$ to logic signals S1, S2, S3, which will adjust the amount of current the charge pump 13 outputs. Initially, when the speed-up circuit 12 indicates that the charge pump 13 should output its maximum current, by outputting a logical one (1) signal $Q_3$, the logic signals S1, S2, S3 will be equivalent to 1, 1, 1, respectively. When the speed-up circuit 12 outputs a logical zero (0) signal $Q_3$, indicating that the charge pump 13 should reduce its current, the logic signals S1, S2, S3 output from the charge pump control circuit 14 will be equivalent to 1, 1, 0 or 1, 0, 1, respectively, for example. This output S1, S2, S3 is set by the charge control signal $CC_{signal}$, an outside input signal whose value depends on the operation for which the PLL 10 output is to be used. The charge pump control circuit 14 converts the charge control signal $CC_{signal}$ to the logic signals S1, S2, S3. This instructs the charge pump 13 to switch out an internal current source (not shown) when the logic signal S1, S2, S3 associated with the current source is zero (0), thereby dividing the current of the charge pump 13 by a number m (e.g., 3, 6, or 9).

The charge pump control circuit 14 provides the PLL 10 with the ability to slew the output frequency $F_O$ toward lock at the fastest rate possible, instead of at a constant rate, using the maximum charge pump 13 output current. As should be well known to those having skill in the art, the faster damping of the PLL 10 output frequency $F_O$ is a result of the high frequency response to the error signals U, D from the PFD 11. Once the PLL circuit 10 outputs the desired frequency, the charge pump control circuit 14 reduces the charge pump 13 output current, which reduces the output frequency response of the PLL 10 and improves jitter performance.

The charge pump 13 outputs a current that charges or discharges the capacitors C1, C2 of the loop filter 15 to a voltage level VLPF. The charge pump 13 receives the error signals U, D, a voltage input $V_{bp}$ from the common bias generator 16, and the logic signals S1, S2, S3 from the charge pump control circuit 14. $V_{bp}$ is a reference bias voltage which controls the charge pump output current. It is well known to those skilled in the art that the charging and discharging of the loop filter 15 capacitors C1, C2 create a voltage change $V_{LPF}$ across the loop filter 15. As $V_{LPF}$ increases, the charge pump 13 output current decreases. This voltage change $V_{LPF}$ is a reference for the common bias generator 16 and the current control circuit 17 that generates the reference signals for controlling the amount of delay created by each delay element $20_a$ . . . $20_n$ of the VCO 18.

The loop filter 15 comprises a first capacitor C1 and a second capacitor C2 with a variable resistor 22. The variable resistor 22 comprises a symmetric load. The loop filter 15 is coupled to the common bias generator 16 as well as the charge pump 13. This loop filter 15 receives a current output generated by the charge pump 13 using the bias voltage $V_{bp}$, and an input voltage $V_{dd}$. As the current from the charge pump 13 shifts to adjust the frequency of the delay cells $20_a$ . . . $20_n$, the variable resistor 22 is also adjusted. As those skilled in the art should know, the use of the variable resistor 22 in the loop filter 15 allows the bias generator 16 to maintain stability over a wide bandwidth.

Figure 5:
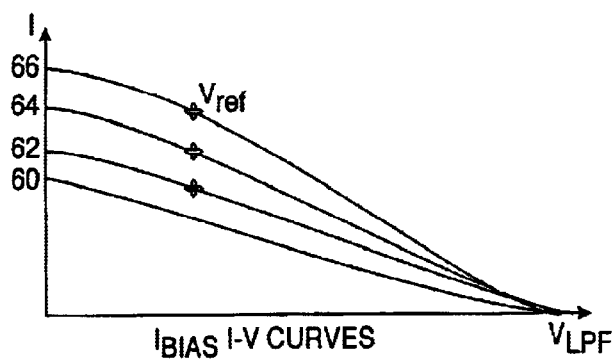
FIG. 5 is an example of a graph of four I–V curves in accordance with the preferred embodiment of the present invention.

The current range control circuit 17, coupled to the loop filter 15 and the bias generator 16, comprises two voltage comparators (not shown) and provides two (2) single bit outputs R0, R1. The current range control circuit 17 receives the loop filter output voltage $V_{LPF}$ and adjusts the level of the bias current $I_{bias}$ generated in the common bias generator 16 through the output leads R0, R1. The voltage comparators in the current range control circuit 17 monitor the voltage $V_{LPF}$ against an internal reference voltage $V_{ref}$ which is indicative of the point where a small change in the voltage $V_{LPF}$ causes a large change in the bias current $I_{bias}$, as disclosed hereinafter. The reference voltage $V_{ref}$, which can be fixed or variable, is illustrated in the FIG. 5 $I_{bias}$ I–V curves 60–66. As those skilled in the art should know, each of these curves 60–66 includes an approximate narrow linear region, illustrated by the curves up to the voltage level $V_{ref}$ in FIG. 5, and a nonlinear region. The nonlinear region, where a small increase in the voltage creates a large decrease in the current, produces a large change in the delay elements $20_a \ldots 20_n$ of the VCO 18, causing increased jitter within the PLL circuit 10. If the PLL circuit 10 is operated past a certain voltage point $V_{ref}$ on the curves, into the nonlinear region, the amount of jitter will increase and the overall performance of the PLL circuit 10 will decrease. Therefore, when the voltage $V_{LPF}$ is greater than the reference voltage $V_{ref}$, PFD 11, speed-up circuit 12, and the charge pump control circuit 14 receive a local reset signal $L_{reset}$ from the current range control circuit 17 which resets the voltage $V_{LPF}$ to zero. The current range control circuit 17 outputs R0, R1 switch, adjusting the bias current $I_{bias}$ to a lower level, as will be described hereinafter.

Figure 4A:
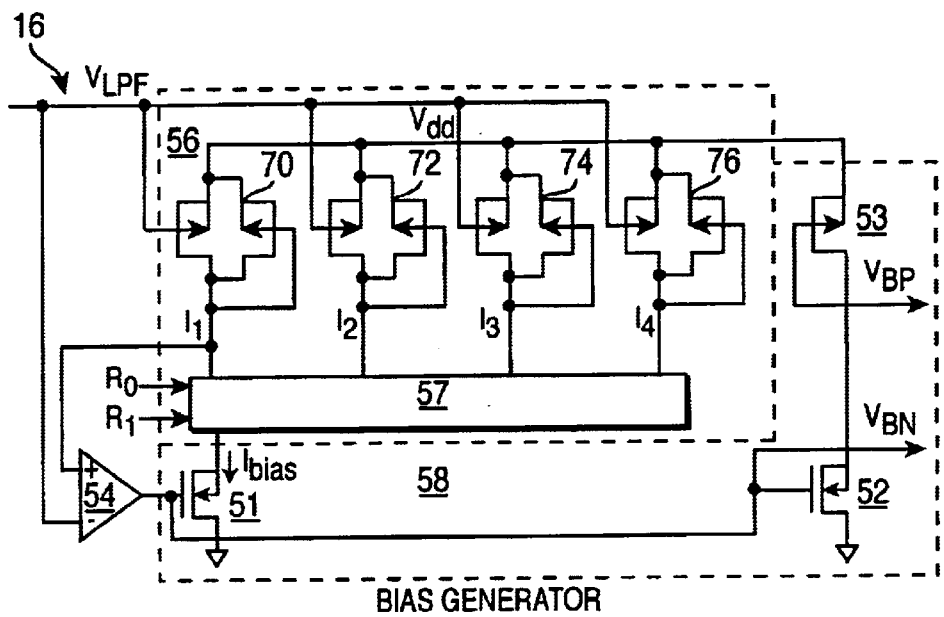
FIG. 4A is a diagram of the bias generator.

Initially, when the PLL circuit 10 is reset, the current range control circuit 17 signals the bias generator 16 to switch on all four currents sources $I_1$, $I_2$, $I_3$, $I_4$, which is indicated by the output 0, 0 for the two outputs R0, R1, respectively (shown in FIG. 4A). When the speed-up circuit 12 detects the crossing of the reference and output frequencies $F_{ref}$, $F_O/N$, the current control circuit 17 is adjusted to find the optimal bias current $I_{bias}$ curve to be utilized by the bias generator 16 for output to the VCO 18. As disclosed above, when the voltage comparators in the current range control circuit 17 detect that $V_{LPF}$ is too high, the current range outputs R0, R1 switch by one (1). For example, after the resetting of the PLL circuit 10, the current range outputs R0, R1 are equivalent to 0, 0. When the comparator detects the high voltage $V_{LPF}$, the current range outputs R0, R1 switch to 0, 1, respectively, which indicates that the common bias generator 16 should switch off current source $I_4$. The current range control circuit 17 also outputs an internal reset signal $L_{reset}$ to the PFD 11, speed-up circuit 12, and the charge pump control circuit 14, which resets the loop filter 15 voltage $V_{LPF}$ to zero (0). Each time the voltage comparators of the loop filter 15 detect this condition, the current range outputs R0, R1 increase by one (1), and another current source is switched off. This process continues until R0, R1 is equivalent to 1, 1, where the only remaining current source is $I_1$. At this point, the current range control circuit 17 signals to the common bias generator 16 to remain at the lowest current level $I_1$.

If the reference voltage $V_{ref}$ is greater than the loop filter voltage $V_{LPF}$, the current range control circuit 17 indicates to the bias generator 16 to remain at the present current level, which is considered the optimal operating point for the process utilizing the output frequency signal $F_O$. As those skilled in the art should know, even though the current range control circuit 17 is illustrated utilizing two (2) single bit outputs R0, R1, a single two-bit output may also be utilized, or any signaling scheme which provides a selective control output.

Figure 4B:
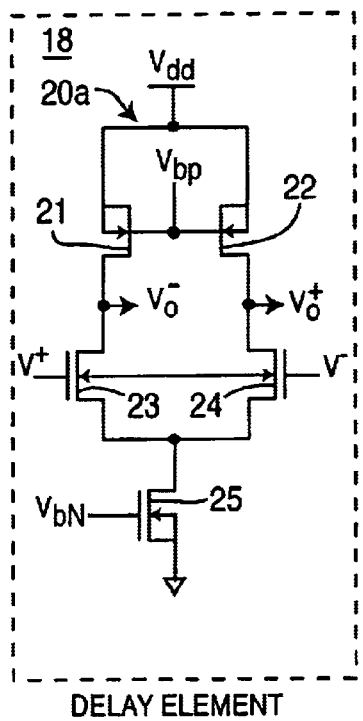
FIG. 4B is a diagram of a delay element of the VCO in accordance with the preferred embodiment of the present invention (only one is shown though there are a plurality of delay cells $20_a \ldots 20_n$ used)

Referring to FIGS. 4A and 4B, the present invention utilizes a single common bias generator 16 comprising a bias current generator 56, a bias voltage generator 58 and a differential amplifier 54. The differential amplifier 54 reduces the noise from the power supply, which improves the power supply rejection ratio performance of the PLL circuit 10. The bias current generator 56 includes four symmetric loads 70, 72, 74, 76 and a switching circuit 57. Each of the symmetric loads 70, 72, 74, 76 (which may or may not have the same device widths), has as its voltage source $V_{dd}$ and the low pass filter 15 output signal $V_{LPF}$ as its gate voltage. The four symmetric loads 70, 72, 74, 76 act as current sources $I_1$, $I_2$, $I_3$, $I_4$. These current sources $I_1$, $I_2$, $I_3$, $I_4$ are switched on and off by the switching circuit 57. The current range control circuit 17 outputs R0, R1 dictate to the switching circuit 57 which of the current sources $I_1$, $I_2$, $I_3$, $I_4$ should be on and which should be off. As should be known to those skilled in the art, there are numerous switching circuits that are responsive to a digital input and can be used as described herein. In this manner, the current range control circuit 17 provides four (4) discrete levels of bias current $I_{bias}$ to control the delay elements $20_a \ldots 20_n$ within the VCO 18. This allows for better control of the PLL circuit 10 by providing the flexibility of varying the current slope without having to vary the delay cell itself. The bias current $I_{bias}$ is output from the bias current generator 56 to the bias voltage generator 58.

The bias voltage generator 58 comprises two n channel transistors 51, 52 and one p channel transistor 53. The gate voltage to n channel transistors 51, 52 is connected to a differential amplifier 54. This differential amplifier 54 eliminates the noise generated by power supply voltage $V_{dd}$. The n channel transistors 51, 52 are configured such that the bias current $I_{bias}$ through transistor 51 is mirrored onto transistor 52 and reflected up to transistor 53. When the bias current $I_{bias}$ is mirrored in this way, two reference voltages are created. The two reference voltages are the bias voltages $V_{bn}$ and $V_{bp}$ which determine the amount of delay for each delay element $20_a \ldots 20_n$ within the VCO 18. Using this common bias generator 16 and a selectable number of delay cells will provide better linearity in the overall delay.

The voltage controlled oscillator (VCO) 18 is coupled to the common bias generator 16 and a frequency divider 19. Although only one delay element $20_a$ is shown for clarity, it should be understood that the VCO 18 includes a plurality of differential delay elements $20_a \ldots 20_n$. The delay elements $20_a \ldots 20_n$ are configured in such a way that the voltage inputs $V_+$, $V_-$ of the delay elements come from the voltage outputs $V_O^+$, $V_O^-$ of the preceding delay elements. The voltage outputs $V_O^+$, $V_O^-$ from the last delay element $20_n$ are feedback to the voltage inputs $V^+$, $V^{31}$ of the first delay element $20_a$. This configuration generates the desired output frequency $F_O$.

Each delay cell $20_a \ldots 20_n$ contains two p channel transistors 21 and 22 and three n channel transistors 23, 24, 25. Transistors 23, 24 act as switches in the delay cell $20_a$ and determine the actual delay for each element based on the bias current $I_{bias}$ via the voltages $V_{bn}$ and $V_{bp}$. The p channel transistors 21, 22 act as current sources for the transistors 23, 24. Transistor 25 acts as a current source as well. The p channel transistors 21, 22 are biased by the voltage $V_{bp}$. Since the amount of bias current $I_{bias}$ determines the voltage level of $V_{bp}$, the delay element delay time changes with the $V_{bp}$. Transistors 23 and 24 receive a voltage input $V^+$ and $V^-$. The current supplied by transistor 22 does not pass through transistor 24 when transistor 24 is "off" (or not conducting). Likewise, when transistor 23 is not conducting, the current provided by transistor 21 does not pass through transistor 23. There are parasitic capacitances at the inputs of transistors 23 and 24 that charge and discharge to affect the voltages $V^+$ and $V^-$, which rise and fall. When transistors 23 and 24 are on and off, respectively, the charge on the parasitic capacitors at the input of transistors 23 and 24 on the subsequent delay cell will be affected. When transistor 23 is turned on, it discharges the parasitic capacitances of the next delay cell and $V_{O-}$ changes from $(V_{dd}-Vds\ 21)$ to $(0V+V_{ds}25+V_{ds}23)$. Likewise, when transistor 24 is off, transistor 22 charges the capacitance of the following delay cell and $V_O^+$ changes from $(0V+V_{ds}\ 25+V_{ds}\ 24)$ to $(V_{dd}-Vds\ 22)$, Vds 22 at saturation. As is well known to those skilled in the art, the delay provided by the delay cell is equivalent to the duration between turning on transistor 23 and turning off transistor 24, and when the voltages $V^+$ and $V^-$ are equal. When this point is reached, the transistors in the next delay cell are activated. $V_O^+$ and $V_O^-$ are the output voltages of each delay cell that provide the input voltages $V^+$, $V^-$ to the next delay cell.

The frequency output from the VCO 18 is then input to a frequency divider 19. Since the output frequency $F_O$, is a multiplied version of the reference frequency $F_{ref}$, by a factor of N times, the frequency divider 19 eliminates this N factor for comparison to the reference frequency $F_{ref}$.

Figure 6:
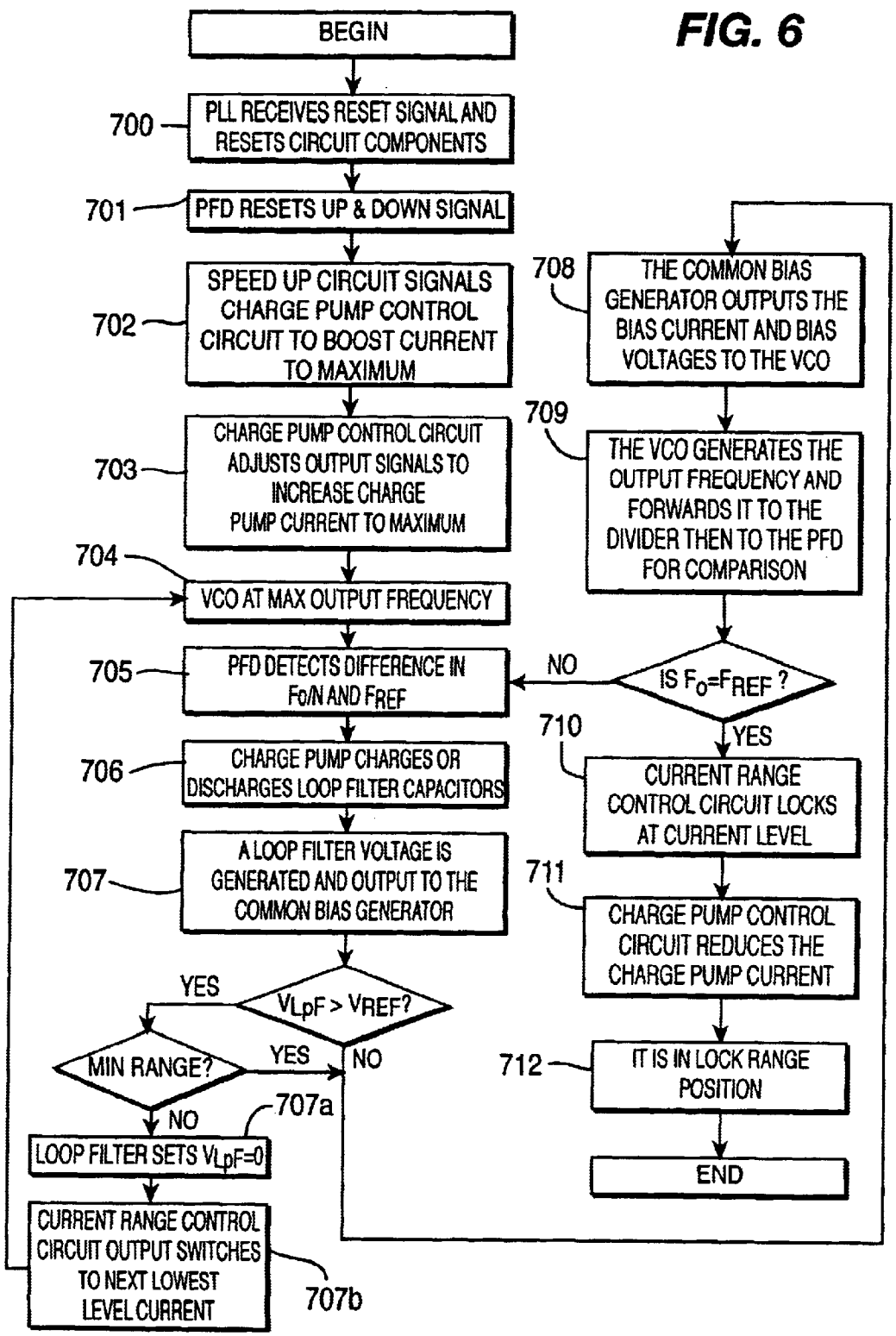
FIG. 6 is a flow diagram in accordance with the preferred embodiment of the present invention.

The flow diagram in accordance with the present invention is illustrated in FIG. 6. The PLL 10 receives a reset signal $PLL_{reset}$ from an external source and resets all PLL circuit 10 components (step 700). Upon receipt of this reset signal $PLL_{reset}$, the PFD 11 resets the up and down output signals U, D (step 701). The speed-up circuit 12 receives the reset signal $PLL_{reset}$ as well as the output signals of the PFD 11 and sends a signal to the charge pump control circuit 14 to boost the current to maximum (step 702). The charge pump control circuit 14, upon receipt of the signal from the speed-up circuit 12, outputs logic signals S1, S2, S3 to the charge pump 13 to adjust the current in the charge pump 13 to its maximum (step 703). The VCO 18 is set to the maximum output frequency (step 704). The maximum output frequency $F_O$ is then forwarded to the frequency divider 19 where it outputs $F_O/N$ to the phase frequency detector 11 for comparison to the reference frequency $F_{ref}$ (step 709). If $F_O/N$ is equal to $F_{ref}$, the current range control circuit 17 locks at the present current level (step 710) and the charge pump control circuit 14 reduces the charge pump 13 current output (step 711). Once the current output of the charge pump 13 is reduced, the PLL circuit 10 is in the lock range position (step 712). If the two frequencies $F_O/N$, $F_{ref}$ are not equal, the PFD 11 outputs signals U, D whose duration depend on the amount of phase and frequency error that is detected between the two frequency signals $F_{ref}$, $F_O/N$ (step 705). The charge pump 13 receives the control signals U, D, S1, S2, S3 from both the PFD 11 and the charge pump control circuit 14 and outputs a current, which sources or sinks the loop filter capacitors C1, C2 (step 706). As a result of the charging or discharging of the loop filter capacitors C1, C2, the control voltage $V_{LPF}$ is generated (step 707). If the loop filter voltage $V_{LPF}$ is greater than $V_{ref}$ and the current range control circuit 17 is not at the minimum current level, the current control circuit 17 outputs a local reset signal $L_{reset}$ to the loop filter 15, which resets the voltage $V_{LPF}$ to zero (0) (step 707a). If the current range control circuit 17 is at the minimum current level, the common bias generator 16 outputs the bias current $I_{bias}$ and bias voltages $V_{bp}$, $V_{bn}$ to the VCO 18 (step 708), which generates the output frequency $F_O$ (step 709). Since the current range control circuit 17 is at its minimum current level $I_1$, the PLL circuit is in the lock range position (step 712). If the current range control circuit 17 is not at its minimum current level $I_1$, the current range control outputs R0, R1 switch to the next lower level (step 707b). Because of the local reset signal of the current range control circuit 17, the VCO is set to its maximum frequency output (step 704). The described process continues until $F_{ref}$ is equal to $F_O/N$.

This design of the PLL circuit 10, in accordance with the preferred embodiment, will achieve a wide operating frequency range with a fast lock up circuit and good jitter performance over a wide power supply voltage range and short lock in time. The differential VCO 18, operating in the biasing current mode, provides a much wider operating frequency range with high common-mode noise immunity. The common biasing technique provides the necessary bias with less sensitivity to temperature and process variations. It also provides better power supply rejection ratio and current range calibration regulation when the power supply droops or when process variations change.

While a specific embodiment of the present invention has been shown and described, many modifications and variations can be made by one skilled in the art without departing from the spirit and scope of the invention. The above description serves to illustrate and not limit the particular form in any way.

What is claimed is:

1. A phase locked loop (PLL) circuit, wherein a voltage controlled differential oscillator is adjusted to generate an output frequency signal which is a selected multiple of an input reference signal, said PLL comprising:

an oscillator control circuit for increasing and decreasing said output frequency signal initially at a relatively high frequency response;

a phase and frequency detector for detecting a phase shift and frequency shift between said reference signal and said output signal and producing an error signal;

a fast lock circuit, responsive to said error signal, for detecting when said output frequency signal passes said selected multiple of said reference signal; and said oscillator control circuit coupled to said fast lock circuit such that said frequency response is reduced when the reference signal passage is detected before the PLL achieves a lock state.

2. The PLL circuit of claim 1 wherein said oscillator control circuit comprises:

a charge pump, for generating a charge current, which charges and discharges a loop filter;

a charge pump control switch associated with said fast lock circuit and charge pump for reducing said charge current when said reference signal passage is detected; and a bias generator responsive to said charging and discharging of said loop filter such that a bias current and first and second bias voltages are generated to control said differential oscillator.

3. The PLL circuit of claim 2 wherein said bias generator comprises:

a bias current generator having a plurality of current sources for generating said bias current; and a bias voltage generator for receiving said bias current from said bias current generator and generating said first and second bias voltages.

4. The PLL circuit of claim 3 wherein said bias generator has a current source switching circuit and further comprising a bias control circuit, coupled to said bias generator and an output of said loop filter, for controlling said bias generator by selectively switching in and out said current sources in response to the output of said loop filter.

5. The PLL circuit of claim 2, whereby each of said current sources includes a symmetric load for generating an output current.

6. The PLL circuit of claim 3 wherein said voltage controlled differential oscillator comprises a plurality of selectively controlled delay elements, each of said delay elements including;

a first input associated with a negative output, a second input associated with a positive output, said positive and negative outputs selectively coupled to a constant voltage source responsive to a first bias voltage, said positive and negative outputs also selectively coupled to a ground and being responsive to a second bias voltage and said first and second voltage inputs, said selective coupling of said constant voltage source and said positive output being a first single transistor, and said selective coupling of said constant voltage source and said negative output being a second single transistor.

7. The PLL circuit of claim 6 whereby said plurality of selectively controlled delay elements are connected in series; the outputs of one delay element being coupled to the inputs of the next delay element.

8. A phase locked loop (PLL) method for controlling a voltage controlled differential oscillator to generate an output frequency signal which is a selected multiple of an input reference signal comprising:

increasing or decreasing said output frequency signal from the oscillator at a relatively high frequency response towards the selected multiple of the reference signal;

detecting a phase shift between said reference signal and said output frequency signal and producing an error signal;

detecting when said output frequency signal passes said selected multiple of said reference signal; and increasing and decreasing said output frequency signal at a reduced frequency response when the reference signal passage is detected before the PLL achieves a lock state.

9. A method of adjusting a bias current output by a bias generator used in a phase locked loop to control a differential oscillator, such that said differential oscillator output frequency signal is a selected multiple of an input reference signal, said method comprising the steps of:

controlling the bias generator, by switching in or out any of a plurality of current generators in response to a binary switch signal;

monitoring a bias generator input voltage;

comparing said input voltage to a reference voltage;

incrementing said binary switching signal in response to said comparison to identify an optimal bias current; and maintaining the optimal bias current until the PLL is reset.

* * * * *

UNITED STATES PATENT AND TRADEMARK OFFICE
CERTIFICATE OF CORRECTION

PATENT NO. : 6,646,512 B2
DATED : November 11, 2003
INVENTOR(S) : Abbasi et al.

It is certified that error appears in the above-identified patent and that said Letters Patent is hereby corrected as shown below:

Title page,
Item [12], delete "Abassi et al." and insert therefor -- Abbasi et al. --.
Item [75], Inventors, delete "Saeed Abassi" and insert therefor -- Saeed Abbasi --.

Column 3,
Line 12, after the word "frequencies" delete "Fo" and insert therefor -- Fo/N --.

Column 4,
Line 27, after the word "level", delete "VLPF" and insert therefor -- VLPF --.

Column 6,
Line 34, after the word "inputs", delete "V+, V-" and insert therefor --  V+, V- --.
Line 37, after the word "inputs", delete "V+, V31" and insert therefor V+, V- --.
Line 62, after the word "and", delete "Vo-" and insert therefor -- Vo- --.
Line 62, after the word "from", delete "(Vdd-Vds 21)" and insert therefor
-- (Vdd-Vds 21) --.
Line 63, delete "Vds25+Vds23)" and insert therefor -- Vds 25+Vds 23) --.
Line 65, after the word "to", delete "(Vdd-Vds 22)" and therefor -- (Vdd-Vds 22) --
Line 66, delete "Vds 22" and insert therefor -- Vds 22 --.

Signed and Sealed this

Fifteenth Day of June, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,646,512 B2
DATED : November 11, 2003
INVENTOR(S) : Abbasi et al.

It is certified that error appears in the above-identified patent and that said Letters Patent is hereby corrected as shown below:

Title page,
Item [12], delete "Abassi et al." and insert therefor -- Abbasi et al. --.
Item [75], Inventors, delete "Saeed Abassi" and insert therefor -- Saeed Abbasi --.

Column 3,
Line 12, after the word "frequencies", delete "$F_o$" and insert therefor -- $F_o/N$ --.

Column 4,
Line 27, after the word "level", delete "VLPF" and insert therefor -- $V_{LPF}$ --.

Column 6,
Line 34, after the word "inputs", delete "$V_+$, $V_-$" and insert therefor -- $V^+$, $V^-$ --.
Line 37, after the word "inputs", delete "$V^+$, $V^{31}$" and insert therefor -- $V^+$, $V^-$ --.
Line 62, after the word "and", delete "$V_{o-}$" and insert therefor -- $V_o^-$ --.
Line 62, after the word "from", delete "$(V_{dd}-Vds\ 21)$" and insert therefor -- $(V_{dd}-V_{ds}\ 21)$ --.
Line 63, delete "$V_{ds}25+V_{ds}23)$" and insert therefor -- $V_{ds}\ 25+V_{ds}\ 23)$ --.
Line 65, after the word "to", delete "$(V_{dd}-Vds\ 22)$" and insert therefor -- $(V_{dd}-V_{ds}\ 22)$ --.
Line 66, delete "Vds 22" and insert therefor -- $V_{ds}\ 22$ --.

This certificate supercedes Certificate of Correction issued June 15, 2004.

Signed and Sealed this

Fourteenth Day of June, 2005

JON W. DUDAS
*Director of the United States Patent and Trademark Office*